United States Patent
Kondo

(10) Patent No.: US 11,144,106 B2
(45) Date of Patent: Oct. 12, 2021

(54) BATTERY MANAGEMENT SYSTEM FOR GAUGING WITH LOW POWER

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/366,514

(22) Filed: Mar. 27, 2019

(65) Prior Publication Data

US 2019/0220079 A1 Jul. 18, 2019

Related U.S. Application Data

(63) Continuation-in-part of application No. 16/059,756, filed on Aug. 9, 2018, now Pat. No. 10,423,211, which is a continuation of application No. 14/684,635, filed on Apr. 13, 2015, now Pat. No. 10,095,297.

(51) Int. Cl.
*G06F 1/32* (2019.01)
*G06F 1/3212* (2019.01)
*H02J 7/00* (2006.01)
*G06F 1/3287* (2019.01)

(52) U.S. Cl.
CPC .......... *G06F 1/3212* (2013.01); *H02J 7/0047* (2013.01); *H02J 7/0063* (2013.01); *G06F 1/3287* (2013.01); *H02J 7/0048* (2020.01); *H02J 2007/0067* (2013.01); *Y02D 10/00* (2018.01)

(58) Field of Classification Search
CPC ....................................................... G06F 1/32
See application file for complete search history.

(56) References Cited

U.S. PATENT DOCUMENTS

| | | |
|---|---|---|
| 5,268,630 A | 12/1993 | Bhagwat |
| 8,664,919 B2 | 3/2014 | Yamada et al. |
| 10,095,297 B2 | 10/2018 | Kondo |
| 2005/0099155 A1 | 5/2005 | Okuda et al. |
| 2006/0097579 A1 | 5/2006 | Okuda et al. |
| 2009/0176159 A1 | 7/2009 | Zhamu et al. |
| 2009/0305135 A1 | 12/2009 | Shi et al. |
| 2011/0112781 A1 | 5/2011 | Anderson et al. |
| 2011/0153241 A1 | 6/2011 | Abe |
| 2012/0029851 A1 | 2/2012 | Nakayama et al. |
| 2012/0049802 A1 | 3/2012 | Barsukov et al. |
| 2012/0191400 A1 | 7/2012 | Sontakke et al. |
| 2012/0203484 A1 | 8/2012 | Ando et al. |

(Continued)

*Primary Examiner* — Paul B Yanchus, III
(74) *Attorney, Agent, or Firm* — Adam R. Stephenson, Ltd.

(57) ABSTRACT

Implementations of fuel gauges may include a voltage sensor coupled with a memory, a processor coupled with the memory, a mode control logic circuit coupled with the voltage sensor, and a sampling timer coupled with the voltage sensor. The memory may include a plurality of relative state of charge (RSOC) values of a battery. The plurality of RSOC values may be used to calculate a plurality of internal resistance values. The fuel gauge may be configured to either increase, decrease, or maintain a sampling frequency based upon a measured power being drawn by a load coupled to the battery.

20 Claims, 12 Drawing Sheets

(56) References Cited

U.S. PATENT DOCUMENTS

| | | |
|---|---|---|
| 2012/0306450 A1* | 12/2012 | Nakayama ........... G01R 31/367 320/134 |
| 2013/0038289 A1 | 2/2013 | Tse |
| 2013/0063094 A1 | 3/2013 | Gibbs et al. |
| 2013/0093428 A1 | 4/2013 | Tinnemeyer |
| 2013/0173103 A1 | 7/2013 | Ando et al. |
| 2013/0226380 A1 | 8/2013 | Ando et al. |
| 2013/0320989 A1 | 12/2013 | Inoue et al. |
| 2014/0159737 A1 | 6/2014 | Suzuki |
| 2014/0232422 A1 | 8/2014 | Sontakke et al. |
| 2014/0303914 A1 | 10/2014 | Sejima |
| 2014/0361743 A1 | 12/2014 | Lin et al. |
| 2015/0064510 A1 | 3/2015 | Wang et al. |
| 2015/0161587 A1 | 6/2015 | Khan et al. |
| 2015/0178723 A1 | 6/2015 | Khan et al. |
| 2015/0213433 A1 | 7/2015 | Khan |
| 2015/0234013 A1 | 8/2015 | Migita et al. |
| 2015/0324791 A1 | 11/2015 | Khan |
| 2015/0326545 A1 | 11/2015 | Khan |
| 2015/0369873 A1 | 12/2015 | Nakao et al. |
| 2016/0013670 A1 | 1/2016 | Tohara et al. |
| 2016/0052410 A1 | 2/2016 | Zhou |
| 2016/0052505 A1 | 2/2016 | Zhou |
| 2016/0087426 A1 | 3/2016 | Kuranuki et al. |
| 2016/0223498 A1 | 8/2016 | Steingart |
| 2016/0318503 A1 | 11/2016 | Zhou |
| 2016/0329716 A1 | 11/2016 | Inoue |
| 2016/0358172 A1 | 12/2016 | Ziat et al. |
| 2018/0019618 A1 | 1/2018 | Ikefuji |
| 2018/0053971 A1 | 2/2018 | Matsui et al. |
| 2018/0154779 A1 | 6/2018 | Chol et al. |
| 2018/0184360 A1 | 6/2018 | Cavalcanti et al. |

\* cited by examiner

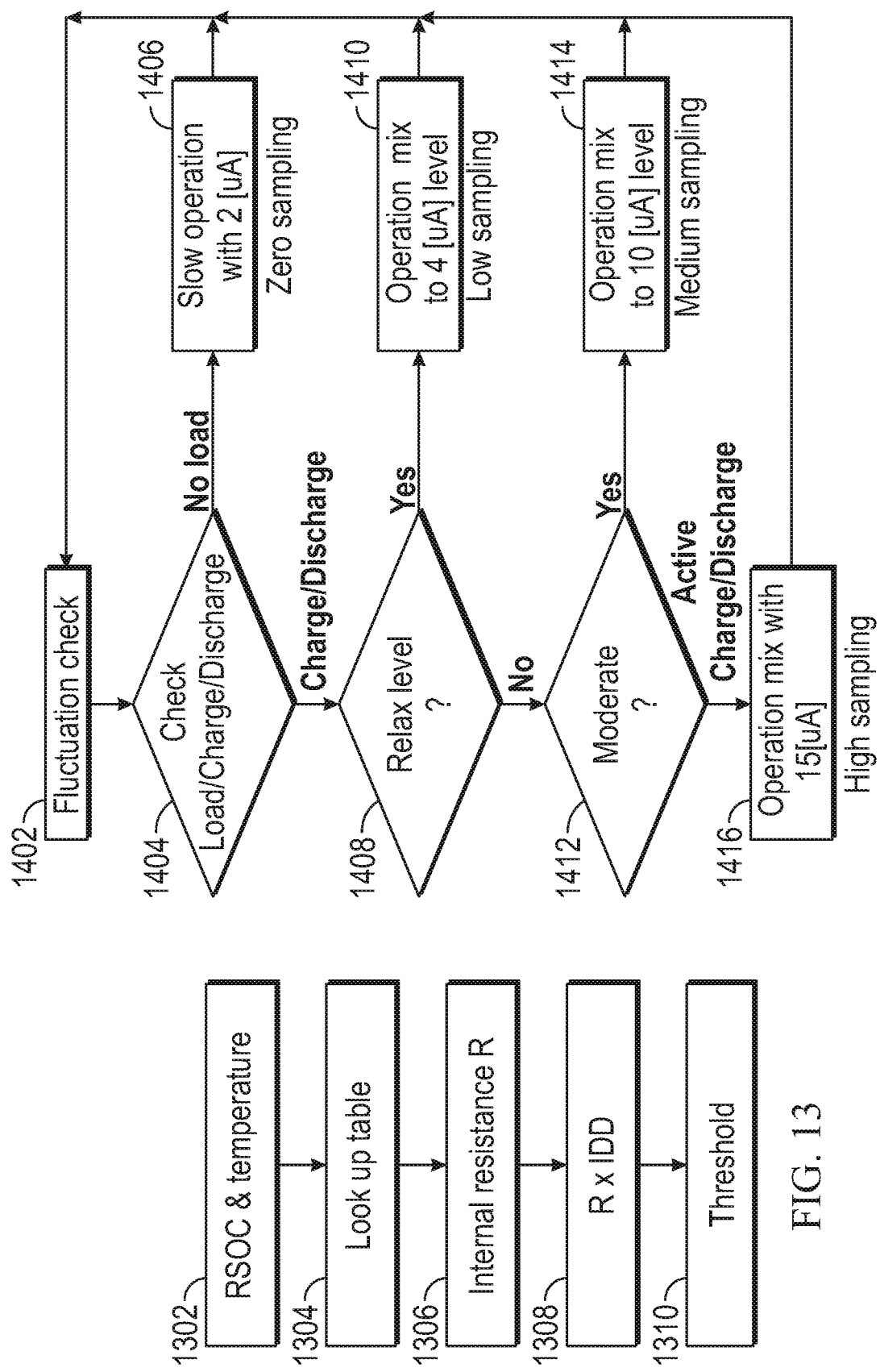

BATTERY MANAGEMENT SYSTEM FOR GAUGING WITH LOW POWER

CROSS REFERENCE TO RELATED APPLICATIONS

This application is a continuation-in-part application of the earlier U.S. Utility patent application to Kondo entitled "Battery Management System for Gauging with Low Power," application Ser. No. 16/059,756, filed Aug. 9, 2018, now pending, which application is a continuation application of the earlier U.S. Utility patent application to Kondo entitled "Variable-Frequency Sampling of Battery Voltage to Determine Fuel Gauge Power Mode," application Ser. No. 14/684,635, filed Apr. 13, 2015, now issued as U.S. Pat. No. 10,095,297, the disclosures of each of which are hereby incorporated entirely herein by reference.

BACKGROUND

Consumer electronics—such as smart phones, laptops, tablets, video cameras and handheld game consoles—are typically powered by batteries. Such batteries are generally rechargeable while in place within the consumer electronic device. Various battery systems are designed to be charged and discharged during a number of charging and discharging cycles.

SUMMARY

Implementations of fuel gauges may include a voltage sensor coupled with a memory, a processor coupled with the memory, a mode control logic circuit coupled with the voltage sensor, and a sampling timer coupled with the voltage sensor. The memory may include a plurality of relative state of charge (RSOC) values of a battery. The plurality of RSOC values may be used to calculate a plurality of internal resistance values. The fuel gauge may be configured to either increase, decrease, or maintain a sampling frequency based upon a measured power being drawn by a load coupled to the battery.

Implementations of fuel gauges may include one, all, or any of the following:

The fuel gauge may be configured to either increase or decrease the sampling frequency from either a zero sampling frequency, a low sampling frequency, a medium sampling frequency, or a high sampling frequency.

The plurality of RSOC values may be derived using a Coulomb counting method.

The plurality of RSOC values may be derived using a voltage tracking method.

The plurality of internal resistance values may be calculated using a temperature of the battery.

The voltage sensor may be configured to repeatedly sample the measured power being drawn by the load from the battery at a sampling frequency corresponding to the power mode of the fuel gauge using the sampling timer.

The fuel gauge may be configured to compare a fluctuation between a plurality of measured power values to one or more threshold values derived from the plurality of RSOC values.

The fuel gauge may include a fluctuation monitor block coupled to the voltage sensor.

Implementations of fuel gauges may include a voltage sensor coupled with a memory, a processor coupled with the memory, a mode control logic circuit coupled with the voltage sensor, a temperature sensor coupled with the memory, and a sampling timer coupled with the voltage sensor. The memory may include a plurality of relative state of charge (RSOC) values and a plurality of temperature parameters of a battery. The plurality of RSOC values and the plurality of temperature parameters may be used to calculate a plurality of internal resistance values. The fuel gauge may be configured to either increase, decrease, or maintain a sampling frequency based upon a measured power being drawn by a load from the battery.

Implementations of fuel gauges may include one, all, or any of the following:

The fuel gauge may be configured to either increase or decrease the sampling frequency from either a zero sampling frequency, a low sampling frequency, a medium sampling frequency, or a high sampling frequency.

The plurality of RSOC values may be derived using a Coulomb counting method.

The plurality of RSOC values may be derived using a voltage tracking method.

The voltage sensor may be configured to repeatedly sample the measured power being drawn by the load from the battery at a sampling frequency corresponding to the power mode of the fuel gauge using the sampling timer.

The fuel gauge may be configured to compare a fluctuation between two measured power values to one or more threshold values derived from the plurality of RSOC values.

Implementations of a method of conserving power may include sampling at least two measured power values of a battery using a voltage sensor coupled with a sampling timer, determining a fluctuation between the at least two measured power values, comparing the fluctuation between the at least two measured power values to one or more threshold power measurements. The one or more threshold power measurements may be derived from a table of values corresponding with a plurality of relative state of charge (RSOC) values of the battery. The method may also include using the fluctuation between the at least two measured power values, sending a signal to a mode control logic circuit to either increase, decrease, or maintain a sampling rate of the fuel gauge.

Implementations of the method for conserving power may include one, all, or any of the following:

The method may include sensing a temperature of the battery through a temperature sensor included in the fuel gauge.

The temperature of the battery may be used to calculate the one or more threshold power measurements.

The RSOC values may be generated through a Coulomb counting method.

The RSOC values may be generated through a voltage tracking method.

The sampling frequency may include either a zero sampling frequency mode, a low sampling frequency mode, a medium sampling frequency mode, or a high sampling frequency mode.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 13 is a flow chart illustrating how threshold values are determined; and

FIG. 14 is a flow chart illustrating how the sampling frequency is determined.

DESCRIPTION

Figure 1:
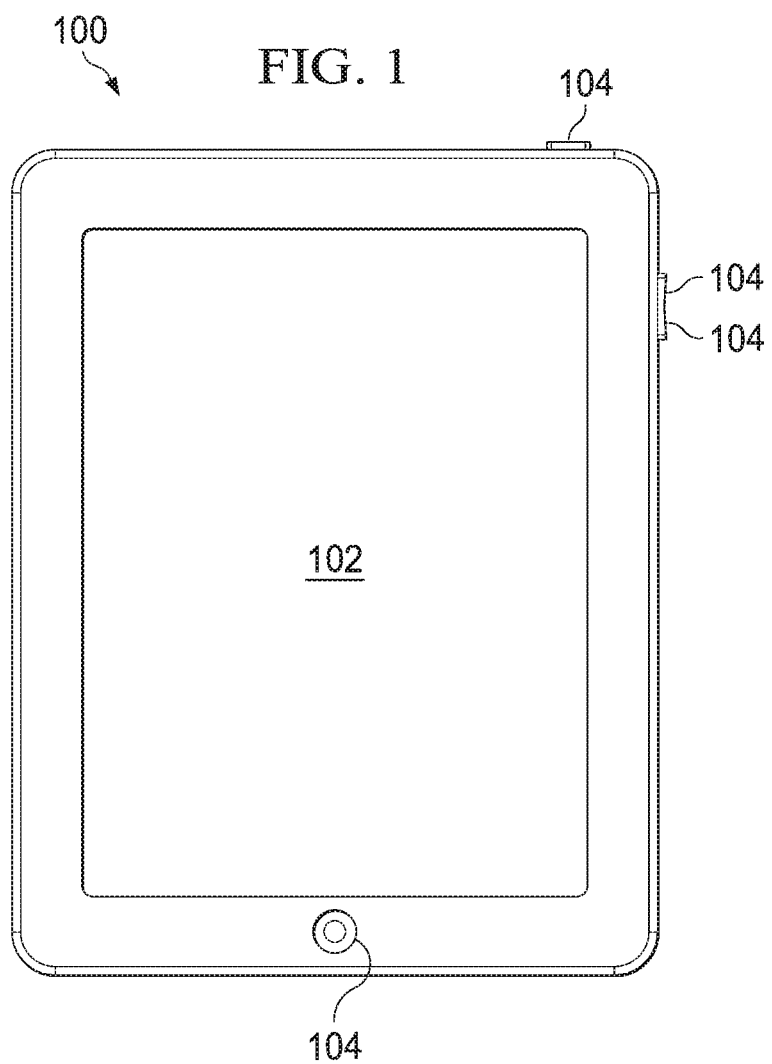
FIG. 1 is a front view of an illustrative electronic device.

Disclosed herein are methods and systems for variable-frequency sampling of an electronic device battery voltage to determine a fuel gauge power mode. An illustrative electronic device implementing the techniques disclosed herein contains a battery supplying power to the components of the electronic device and a fuel gauge that monitors the battery. The fuel gauge is capable of operating in numerous power modes (e.g., standby mode, relaxed mode, operating mode, active mode), each one of which causes the fuel gauge to consume different amounts of power. The fuel gauge selects its power mode based on a sampling of the voltage provided by the battery. The fuel gauge samples this voltage at a variable frequency, with the precise frequency depending on the power mode in which the fuel gauge is currently operating and changing as the fuel gauge power mode changes. Based on the voltage swings between samples and on how often the voltage changes, the fuel gauge either switches to a lower power mode, stays in its currently-enabled power mode, or switches to a higher power mode.

For example, while the fuel gauge is in a standby mode, it may sample the battery voltage once per minute; in a relaxed mode, once every 20 seconds; in an operating mode, once every 10 seconds; and in an active mode, four times per second. If, while in any of these power modes, the fuel gauge consecutively samples the battery voltage a predetermined number of times and determines that there is no voltage change, the fuel gauge autonomously switches to a lower power mode (unless the fuel gauge is already in the lowest available power mode, such as a standby mode). If the fuel gauge consecutively samples the battery voltage the predetermined number of times and determines that there is at least one voltage change but that the greatest voltage change (in either direction) fails to meet or exceed a voltage change threshold, the fuel gauge remains in its currently-enabled power mode. Similarly, if the fuel gauge consecutively samples the battery voltage the predetermined number of times and determines that there is a threshold-exceeding voltage change but that the battery voltage does not change often enough to meet or exceed a rate of change threshold, the fuel gauge remains in its currently-enabled power mode. Finally, if the fuel gauge determines that there is at least one voltage change and that the greatest of these voltage changes meets or exceeds the voltage change threshold, and further if the fuel gauge determines that the battery voltage changes often enough to meet or exceed a rate of change threshold, the fuel gauge switches to a higher power mode (unless the fuel gauge is already in the highest available power mode, such as an active mode). Numerous variations and permutations of this technique are contemplated and included within the scope of the disclosure.

In some embodiments, the sampling frequency may vary even within the same fuel gauge power mode. For example, referring again to the foregoing example, if the fuel gauge determines that there is an increase in voltage variation (i.e., greater voltage swings between samples and/or a greater percentage of samples indicating voltage changes), but the voltage variation is not significant enough to warrant switching modes, the fuel gauge may remain in its currently-enabled power mode but it may increase or decrease its sampling frequency to account for the increased variation in battery voltage.

FIG. 1 is a front view of an illustrative consumer electronic device. In various implementations, the consumer electronic device 100 implements the systems and methods described herein. The electronic device 100 may be any suitable device that uses a battery (e.g., a lithium ion battery). Non-limiting examples of such electronic devices include smart phones (e.g., APPLE iPHONE®, SAMSUNG GALAXY NOTE®), tablets (e.g., APPLE iPAD®, AMAZON KINDLE®), laptops, video cameras (including camcorders), and handheld game consoles (e.g., SONY PLAYSTATION VITA®). Other such devices are contemplated and included within the scope of this disclosure. The illustrative consumer electronic device 100 includes a display screen 102 that is preferably a touch screen. It further includes various tactile input devices 104, such as buttons arranged in various locations around the exterior of the electronic device 100. Additional input and output devices, such as microphones and speakers, also may be incorporated within such a device.

Figure 2:
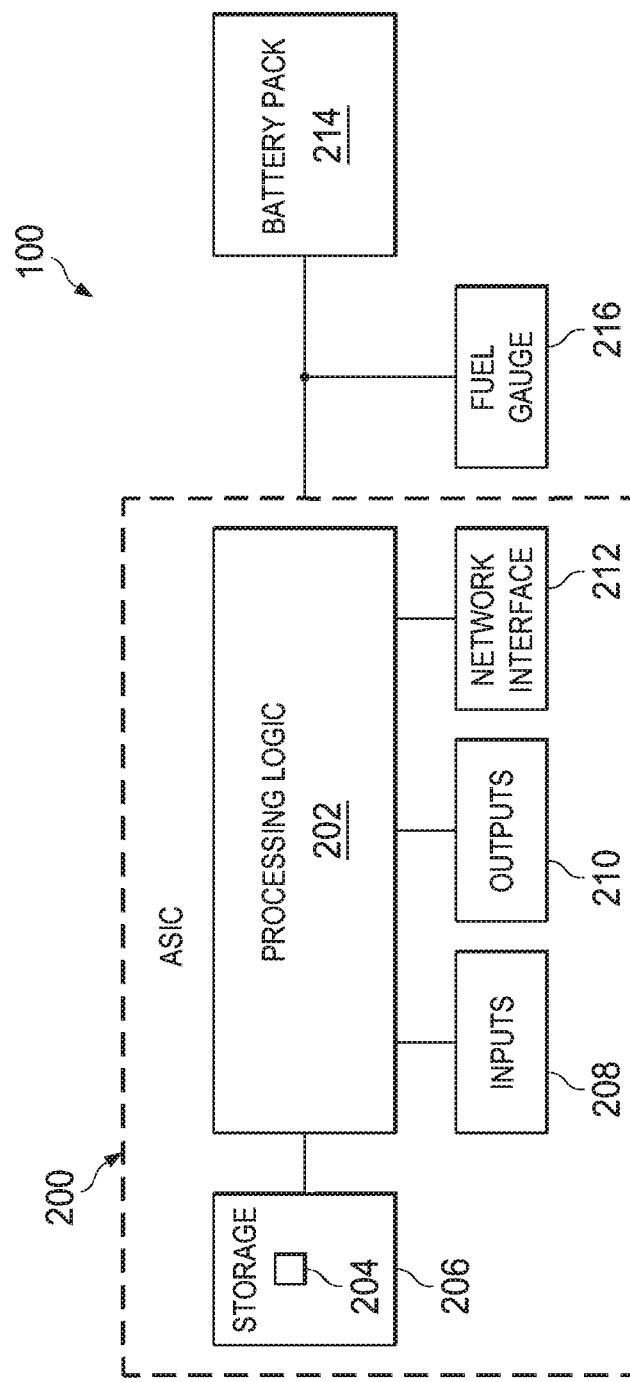
FIG. 2 is a block diagram of at least some components within an electronic device.

FIG. 2 is a block diagram of at least some components within the electronic device 100. The electronic device 100 includes an application-specific integrated circuit (ASIC) 200 comprising processing logic 202 (e.g., a microprocessor), storage 206 coupled to the processing logic 202 and comprising software code 204 (e.g., an operating system or applications), input features 208 (e.g., buttons, touch screen, microphone), output features 210 (e.g., display screen that may be the same as the touch screen, speaker, haptic feedback motor), and a network interface 212 for communicating with other devices (e.g., via the Internet). Other components may be included on the ASIC 200. The ASIC 200 is powered by a battery pack ("battery") 214. A fuel gauge 216 couples to the battery 214. In at least some embodiments, the ASIC 200, the fuel gauge 216 and the battery 214 couple to each other in a parallel configuration, so that the ASIC 200 may receive power from the battery 214 while the fuel gauge 216 monitors the output of the battery 214. Further, in some embodiments the ASIC 200 may be replaced by a plurality of ASICs or other circuitry. The techniques disclosed herein may be implemented in any electronic device in which any suitable type of load (here, the ASIC 200) is powered by the battery 214. In operation, and as described in greater detail with respect to FIG. 3, the fuel gauge 216 monitors the voltage output by the battery 214. As explained above, the fuel gauge 216 autonomously selects its own power mode based on the battery voltage fluctuation—that is, based on the battery voltage swings between samples as well as the frequency with which the battery voltage changes.

Figure 3:
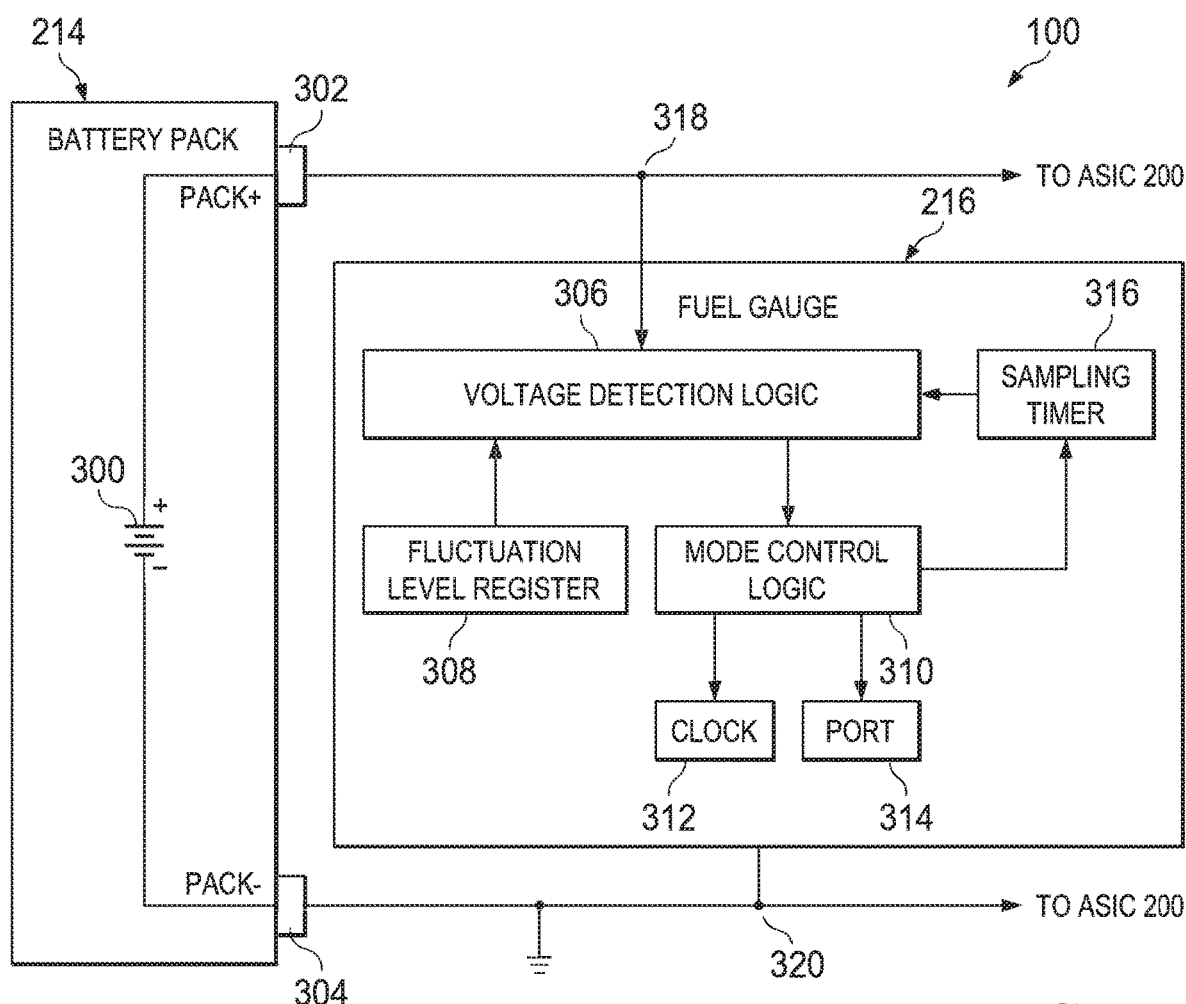
FIG. 3 is a block diagram of at least some components within a fuel gauge of the electronic device.

FIG. 3 is a block diagram of at least some components within a fuel gauge 216 of the electronic device 100. The block diagram of FIG. 3 is conceptual in nature, meaning that at least some of the blocks represent functions performed by the various parts of the electronic device 100. The actual circuit logic used to implement the functions represented by the blocks may vary depending on design considerations and preferences and will be readily known to or determined by one of ordinary skill in the art.

Still referring to FIG. 3, the battery 214 contains a voltage source 300 that creates a potential across terminals 302, 304. The terminal 302 provides a voltage to node 318, which couples to the fuel gauge 216 and to the ASIC 200. The terminal 304 couples to ground and to node 320, which couples to the fuel gauge 216 and the ASIC 200. The fuel gauge 216 comprises voltage detection logic 306, a programmable voltage fluctuation level register 308, mode control logic 310, a clock 312 and port 314, and a sampling timer 316. The programmable register 308 contains the voltage change threshold value and the rate of change threshold value, described above. In operation, the voltage detection logic 306 samples the voltage present at node 318 (i.e., the battery voltage) at a sampling frequency that varies according to the currently-enabled mode of the fuel gauge 216. In at least some embodiments, when the fuel gauge 216 is in a standby mode, the voltage detection logic 306 may sample the battery voltage once per minute; in a relaxed mode, once every 20 seconds; in an operating mode, once every 10 seconds; and in an active mode, four times per second, although the scope of disclosure is not limited to these sampling frequencies for each power mode, nor is the scope of disclosure limited to the use of a single sampling frequency in individual power modes.

If, upon consecutively sampling the voltage a predetermined number of times, the logic 306 determines that the voltage has not changed at all, the fuel gauge 216 switches to a lower power mode. If the logic 306 determines that the voltage has changed, but not by the voltage change threshold stored in the register 308, or if the logic 306 determines that the voltage has changed by the voltage change threshold but that the voltage has not changed as often as required by the rate of change threshold, the logic 306 concludes that there is not enough variation in the battery voltage to warrant an upward power mode switch, and it remains in its currently-enabled power mode. If, however, the logic 306 determines that the battery voltage has changed by the voltage change threshold, and if the logic 306 further determines that the voltage has changed often enough (by any suitable amount, or by some additional minimum threshold programmed into the register 308) to meet or exceed the rate of change threshold, the logic 306 issues a signal to the mode control logic 310 to increase the power mode of the fuel gauge 216.

Figure 4:
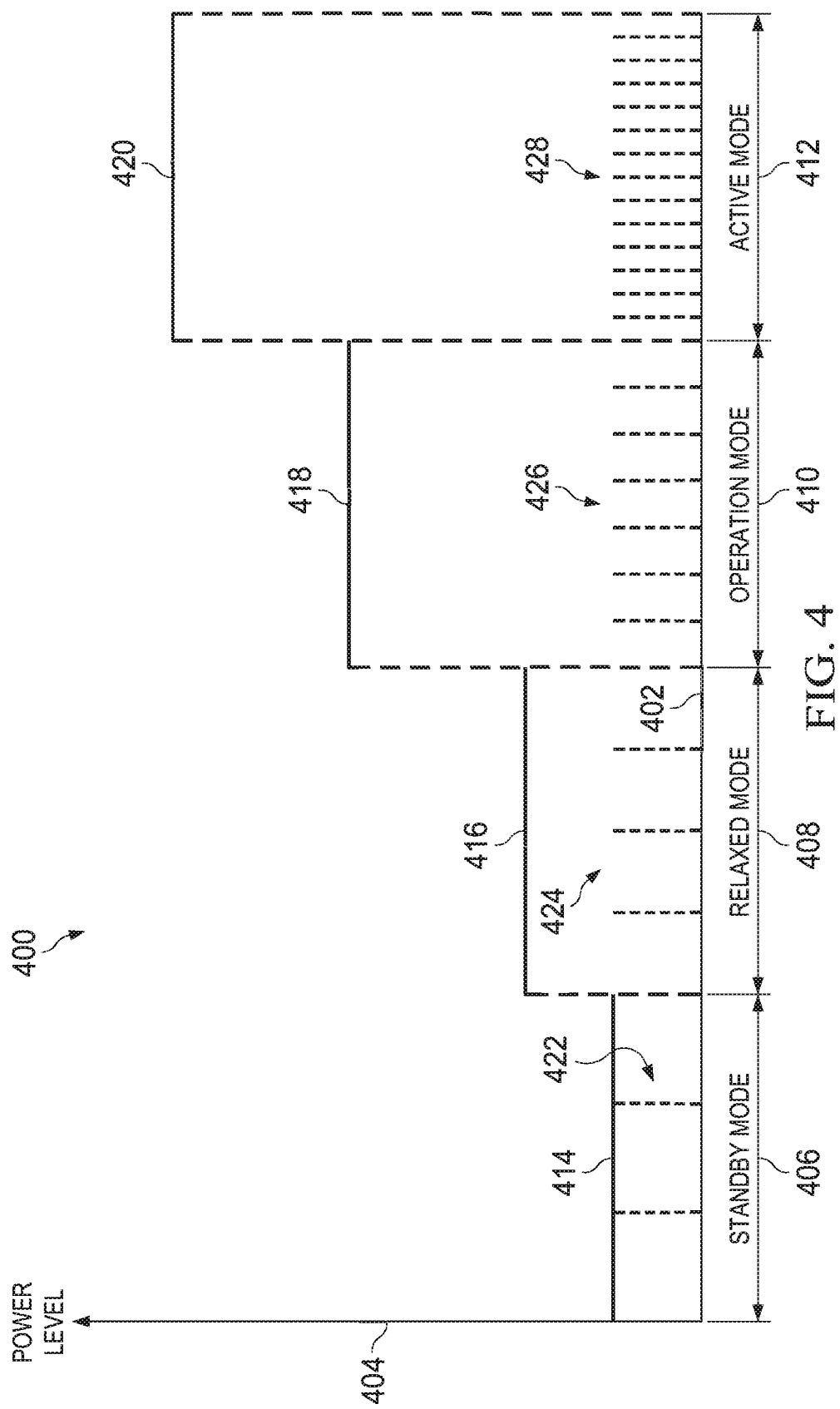
FIG. 4 is a graph illustrating a variable frequency voltage sampling scheme.

FIG. 4 is a graph 400 illustrating a variable frequency voltage sampling scheme. The graph 400 plots different power modes on the x-axis 402 and power level on the y-axis 404. Specifically, graph 400 shows a standby mode 406, a relaxed mode 408, an operation mode 410, and an active mode 412. During the standby mode 406, the power level 414 is relatively low; during the relaxed mode 408, the power level 416 is increased; during the operation mode 410, the power level 418 is further increased; and during the active mode 412, the power level 420 is highest. The sampling frequency at which the fuel gauge samples the battery voltage varies among these power modes. During standby mode 406, numeral 422 indicates a relatively low sampling frequency; during relaxed mode 408, numeral 424 indicates an increased sampling frequency; during the operation mode 410, the sampling frequency 426 is further increased; and during the active mode 412, the sampling frequency 428 is relatively high. Specific, illustrative sampling frequencies are provided above and thus are not reproduced here.

Figure 5:
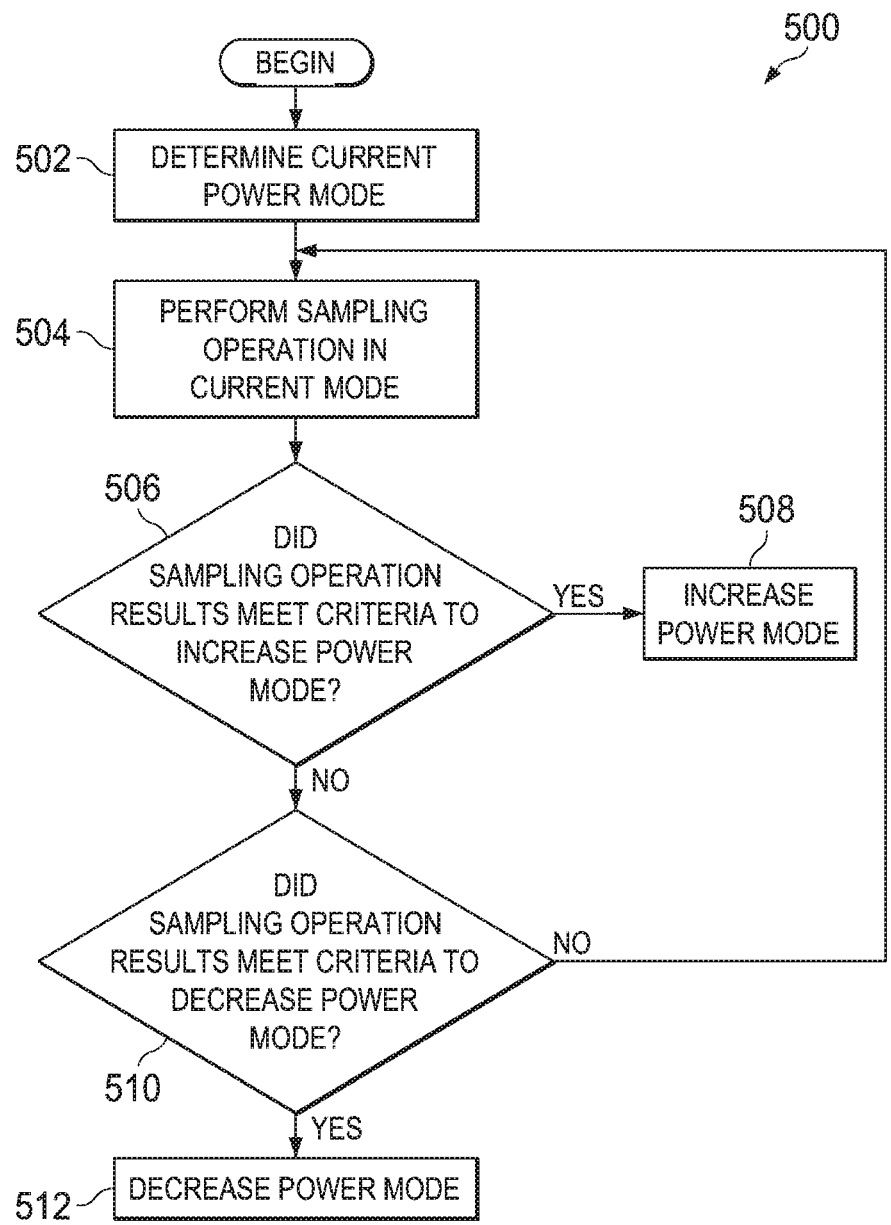
FIG. 5 is a flow diagram of an illustrative method usable to implement the techniques disclosed herein.

FIG. 5 is a flow diagram of an illustrative method 500 usable to implement the techniques disclosed herein. The method 500 begins by determining a current fuel gauge power mode (step 502). The method 500 includes performing a sampling operation in the current power mode (step 504). A sampling operation is a sampling of the battery voltage a predetermined number of times at a predetermined sampling frequency, where the sampling frequency is determined based at least on the current power mode of the fuel gauge. The method 500 then includes determining whether the results of the sampling operation met the criteria for increasing the fuel gauge power mode (step 506). If so, the fuel gauge autonomously increases its power mode (step 508). Otherwise, the method 500 comprises determining whether the results of the sampling operation met the criteria for decreasing the fuel gauge power mode (step 510). If so, the fuel gauge autonomously decreases its power mode (step 512). Otherwise, the currently-enabled power mode is maintained. Control of the method 500 then returns to step 504, as is the case after completion of steps 508 and 512. The method 500 may be modified as desired—for example, to include additional steps, delete steps, or rearrange steps.

Figure 6:
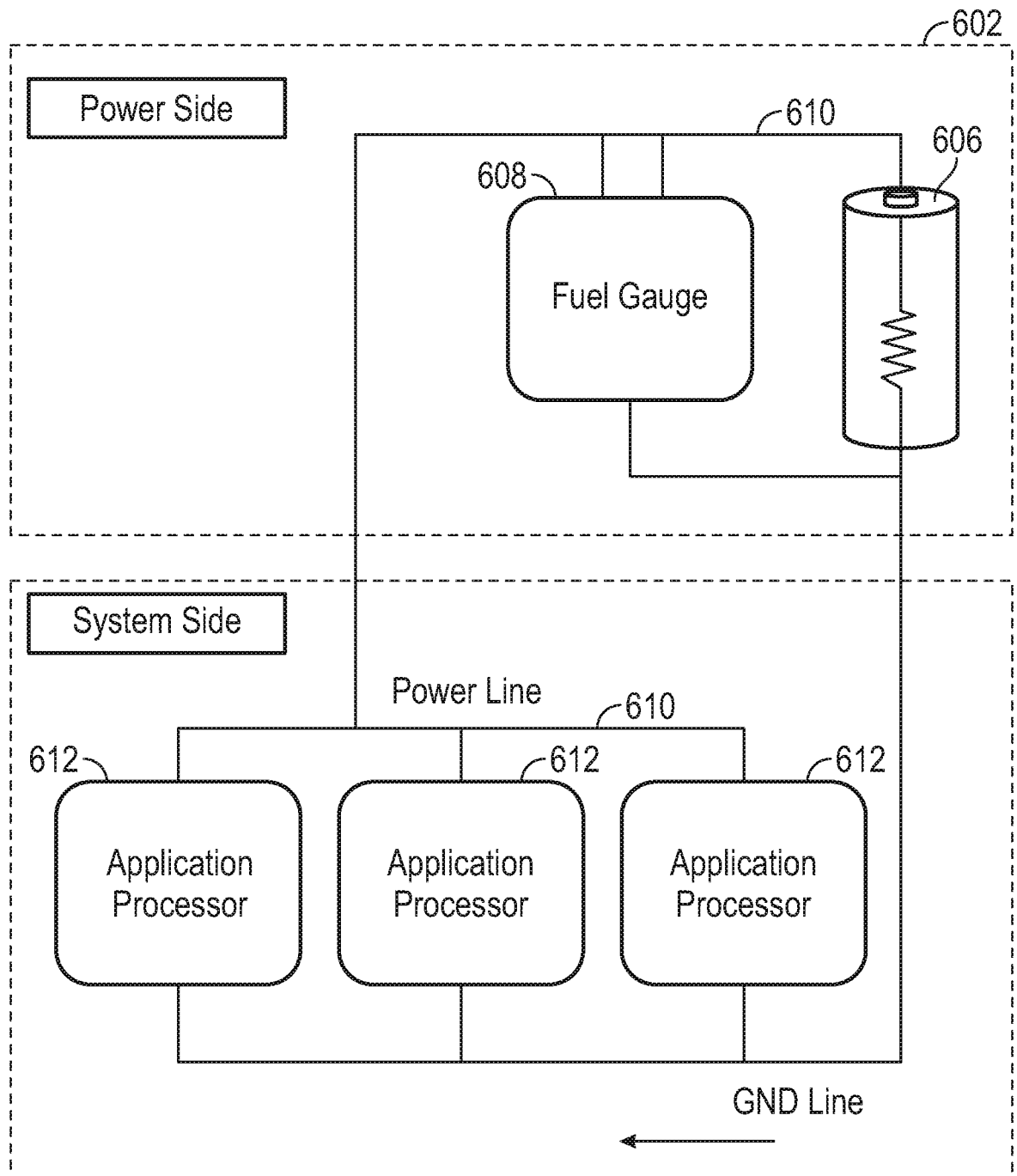
FIG. 6 is a block diagram of select components within an electronic device.

Referring to FIG. 6, a block diagram of select components within an electronic device is illustrated. The electronic device may include a power side 602 and a system side 604. The power side includes a battery 606 and may include a fuel gauge 608. The fuel gauge 608 is coupled to the battery 606 through a power line 610. In this manner, the fuel gauge 608 may monitor the voltage output of the battery 606 through the power line 610 while the battery powers the system side 604. The system side 604 may include one or more processors 612 coupled to the battery 606 through the power line 610. The fuel gauge 608 may be configured to operate in a plurality of power modes corresponding to varying sampling frequencies of the battery. In various implementations, the fuel gauge may be configured to operate in a stand-by mode, a relax mode, a moderate mode, and a normal mode. In other implementations, the fuel gauge may be configured to operate in more than four or less than four modes. In a particular implementation, the fuel gauge 608 may detect voltage fluctuations from the battery caused by varying internal resistance of the battery 606.

Figure 7:
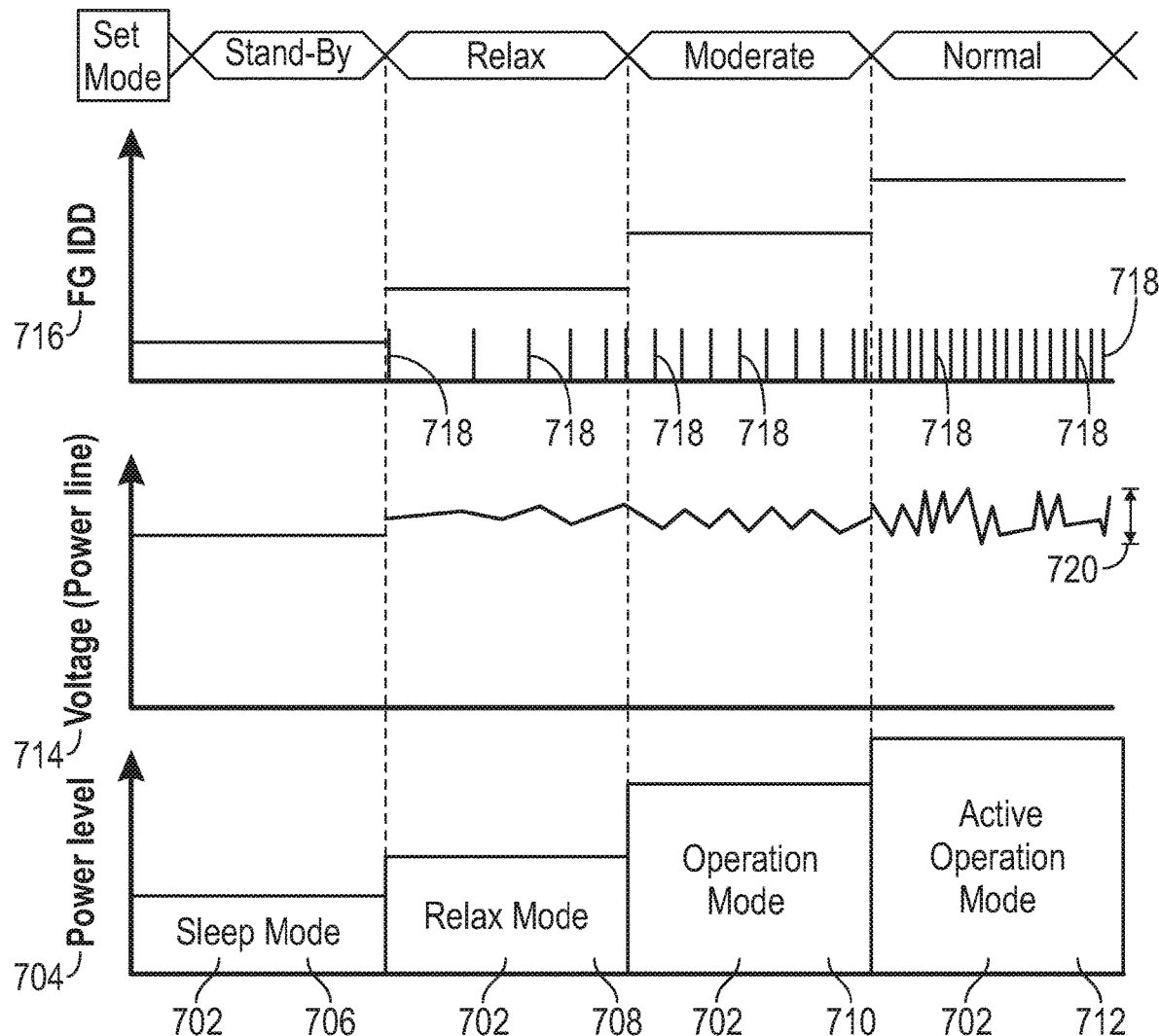
FIG. 7 is a graph illustrating a variable frequency voltage sampling scheme as it relates to a battery's internal resistance and voltage fluctuation.

Referring to FIG. 7, a graph illustrating a variable frequency voltage sampling scheme as it relates to a battery's internal resistance and voltage fluctuation is illustrated. As illustrated, the system includes varying modes 702 relating to the power level 704 being provided by the battery. As illustrated by FIG. 7, the system may include a sleep mode 706, a relax mode 708, an operation mode 710, and an active operation mode 712. In various implementations, the varying modes of the system correspond with fluctuation of the voltage in the power line. As illustrated by FIG. 7, the fluctuation of the voltage 714 may be stable when the system is in a sleep mode or relax mode, and may increase and become less stable as the power level of the system, or current drawn by/provided to the system, increases. The amount of voltage fluctuation 720 may be highest in an active operation mode of the system. In various implementations, the fuel gauge monitors the amount of voltage fluctuation and estimates the system's operation mode. The system's operation may include a sleep mode 706, a relax mode 708, an operation mode 702, and an active operation mode 712. In various implementations, the fuel gauge is configured to optimize its sample rate in accordance with the estimated mode. The fuel gauge may include a plurality of modes corresponding to the operation modes of the system. More specifically, the fuel gauge may include a stand-by mode 722 corresponding to the sleep mode 706, a relax mode 724 corresponding to the relax mode 708, a moderate mode 726 corresponding to the operation mode 702, and a normal mode 728 corresponding to the active operation mode 712. Further, each mode of the fuel gauge may correspond with a sampling rate of the output power of a battery by the fuel gauge. Each of the lines 718 indicates a voltage sample from the power line. As illustrated, the fuel gauge current 716 may be minimal in a stand-by mode and in turn, the voltage may be rarely sampled in the stand-by mode 722 of the fuel gauge. As the voltage fluctuation on the power line increases (or the power level of the system increases) the fuel gauge may increase its mode and sample the voltage of the battery at an increased frequency. While the graph of FIG. 7 illustrates the fuel gauge as having four power modes, a stand-by mode, a relaxed mode, a moderate mode, and a normal mode, various implementations of fuel-gauges may have more or less power modes than four which may correspond to the varying levels of fluctuation of a battery's voltage, and in turn, a corresponding power level of the system.

Figure 8:
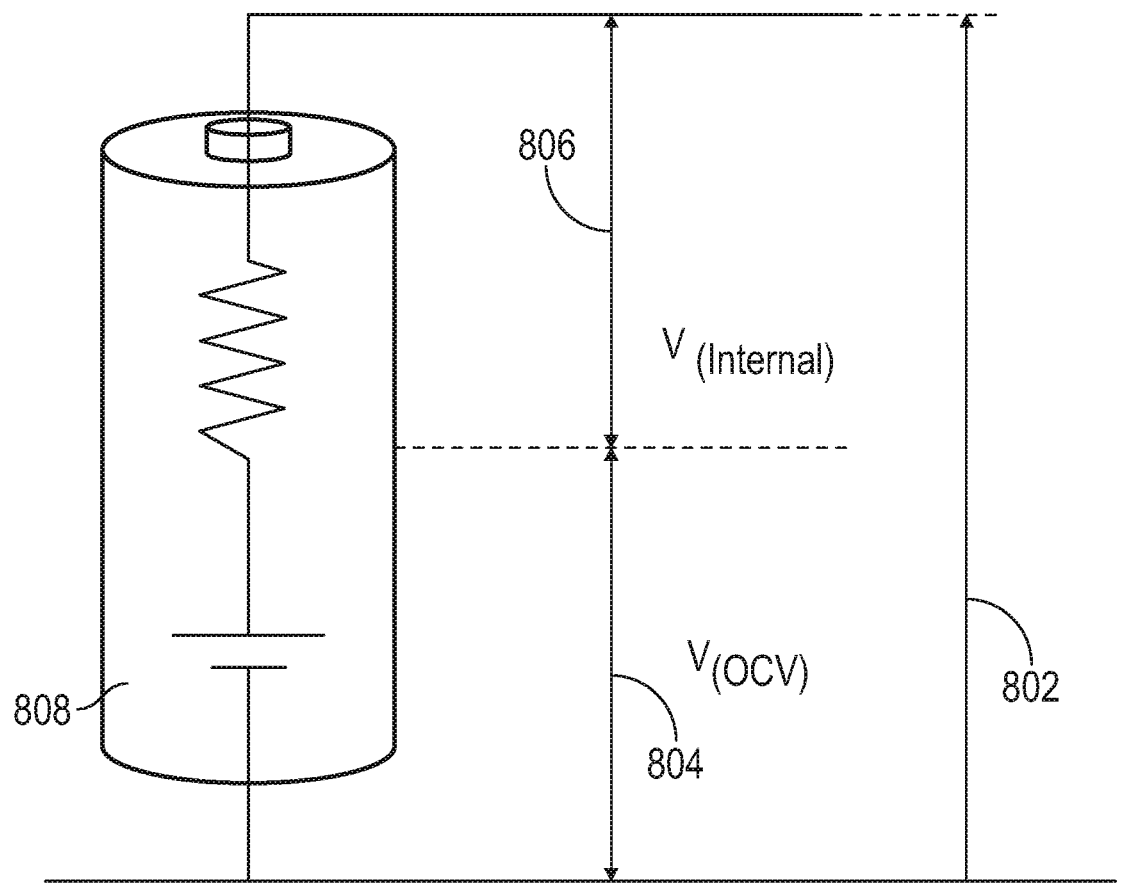
FIG. 8 is a diagram representing the voltage fluctuation of a system.

Referring to FIG. 8, a diagram representing the voltage fluctuation of a system is illustrated. As illustrated, the voltage fluctuation 802 is a combination of the open circuit voltage ($V_{OCV}$) 804 and the internal voltage ($V_{internal}$) 806 of the battery 808. $V_{internal}$ is based upon the internal resistance of the battery as the voltage is a product of the internal resistance and the current being provided by the battery. In various implementations, $V_{OCV}$ 804 may remain constant or substantially constant. Accordingly, the voltage fluctuation may be directly proportional to $V_{internal}$ 806 as the voltage fluctuation 802 is caused by the battery's internal resistance.

Figure 9:
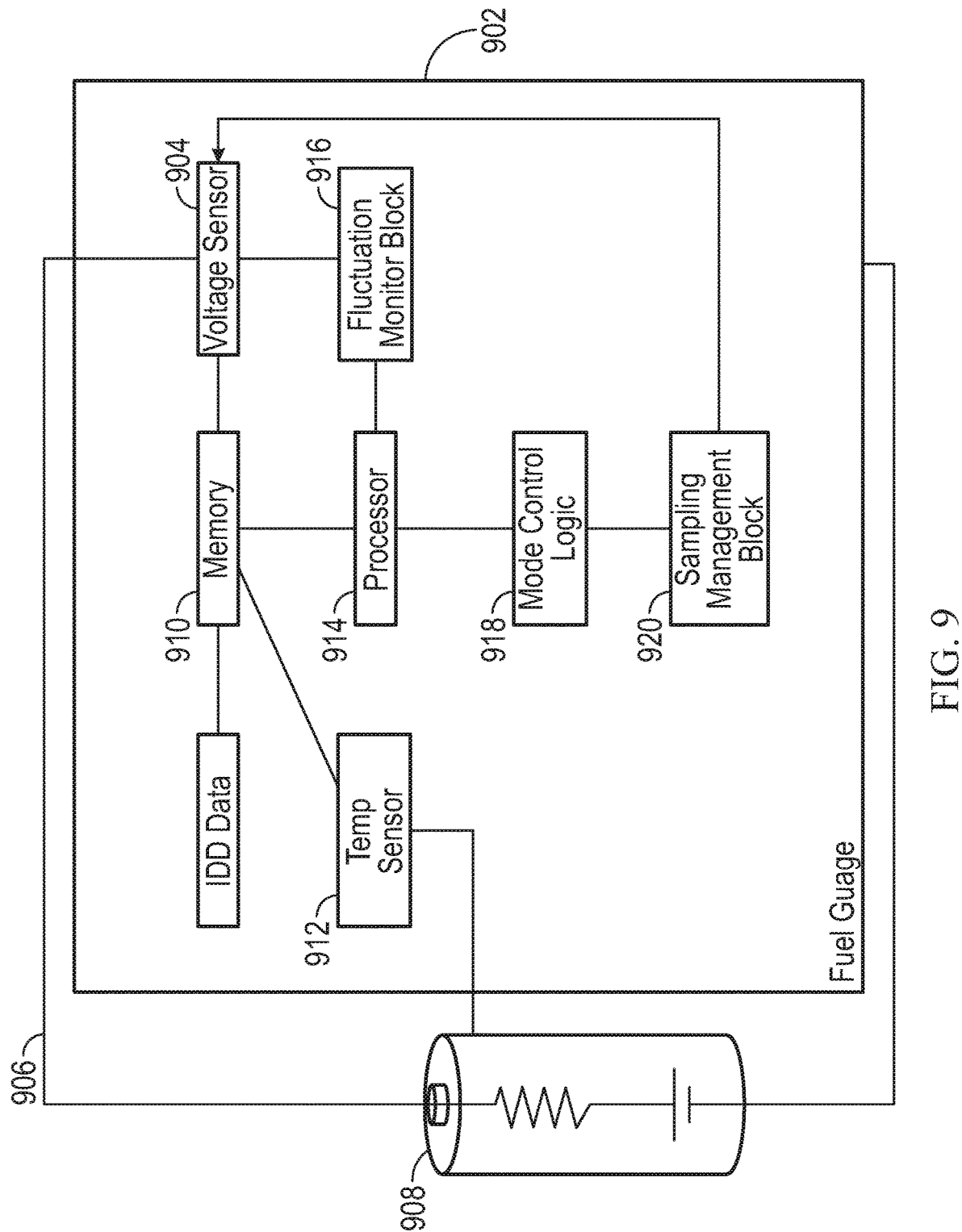
FIG. 9 is a block diagram of select components within a fuel gauge of an electronic device.

Referring to FIG. 9, a block diagram of select components within an implementation of a fuel gauge of an electronic device is illustrated. As illustrated, the fuel gauge 902 includes a voltage sensor 904. The voltage sensor 904 is configured to repeatedly sample measured power values or voltage values from the power line 906 coupled to the battery 908. The voltage sensor 904 may sample the voltage at any sampling frequency disclosed herein. In various implementations, though not illustrated by FIG. 9, the fuel gauge 902 may include a current sensor configured to repeatedly sample a current from the battery. The fuel gauge may also include a temperature sensor configured to repeatedly sample a temperature of the battery. Similarly, in various implementations, though not illustrated by FIG. 9, the fuel gauge may include an analog-to-digital converter (ADC). The ADC may be used to convert any analog signals from any sensors (whether or not disclosed herein) into digital signals. The fuel gauge 902 includes a memory 910 which may be coupled to the voltage sensor 904. Internal resistance data (IDD) corresponding to the battery may be stored in the memory 904. In various implementations, the internal resistance data may be in the form of a plurality of relative state of charge (RSOC) values. The RSOC values may indicate the charge capacity of the battery. While the RSOC of a new battery is the actual state of charge of the new battery, as batteries age, among other things, the RSOC value or capacity decreases as the internal resistance increases. Related $V_{OCV}$ values may also be stored with the RSOC values, or the RSOC values may indicate associated $V_{OCV}$ values.

In various implementations, the RSOC values stored in the memory may be calculated using a Coulomb counting method. In such implementations, Coulomb counting may keep track of the amount of Coulombs extracted from/inserted into the battery and may compute the RSOC as a ratio of remaining Coulombs and battery capacity. The basic technique for Coulomb counting may be based on equation 1, with Q equaling capacity, I equaling resistance, and t equaling time.

$$Q(Li) = \int I(t)dt \qquad \text{Equation 1}$$

In other implementations, the RSOC values may be calculated using a voltage tracking method. In such implementations, the RSOC values may be determined by a capacitance of the battery which may be determined by detecting a voltage of the battery and looking up the voltage value using table of voltage-capacity graphs in order to determine the corresponding capacity of the battery based on the voltage value.

In various implementations, the memory 910 may include a plurality of temperature parameters. The temperature parameters may include corrective factors corresponding to a temperature of the battery necessary to calculate the true internal resistance. As illustrated by FIG. 9, in various implementations the fuel gauge 902 may include a temperature sensor 912 coupled with the memory 910. The temperature sensor 912 may be configured to detect the temperature of the battery 908. While the temperature sensor 912 is illustrated as directly coupled to the memory 910, in other implementations the temperature sensor may be directly coupled to the processor 914. By knowing the temperature of the battery 908, more accurate RSOC values may be calculated by the system in various implementations.

In various implementations, the RSOC values and/or the temperature parameters may be used to calculate a plurality of internal resistance values that correspond with varying internal resistances of the battery 908. While the implementations disclosed herein discuss the use of RSOC values and/or temperature parameters, in other implementations other data may be stored in the memory 910 which may be used to calculate an internal resistance of the battery 908. Further, the data stored in the memory may be variable based upon specific applications. Thus, in various implementations the RSOC data (or other data) put into the memory may vary depending on, among other things, the type of the battery. Examples of different types of batteries that may alter the data stored in the memory may include, by non-limiting example, prism batteries, cylinder batteries, polymer batteries, and any other type of battery. Data relating to manufacturer-specific characteristics of each battery type may also be stored in the memory. Once data has been stored in the memory, the data may be rewritten as needed. In various implementations, an external system may be able to alter the data in the memory based on, by non-limiting example, the kind of battery, the battery manufacturer, and/or the application that the battery is being used for. In other implementations, the fuel gauge may be able to detect the battery being used and may either directly set the parameters and/or data in the memory that need to be used with that battery or instruct an external system to set the parameters and/or data in the memory to be used with that battery.

Still referring to FIG. 9, the fuel gauge 902 includes a processor 914 coupled with the memory 910. The processor 914 may be used to calculate a plurality of threshold values. The threshold values may be calculated by multiplying the plurality of internal resistance values derived from the RSOC values and/or temperature parameters/values with a current of the system. The threshold values calculated may be used to determine the sampling frequency with which the fuel gauge should sample the voltage of the battery. While the processor 914 and the memory 910 are illustrated as two separate and distinct components in FIG. 9, in various implementations the processor and memory may be included in a single component.

The fuel gauge 902 may also include a fluctuation monitor block 916. The fluctuation monitor block may track the fluctuation of the voltages being detected by the voltage sensor 904. Accordingly, the fluctuation monitor block 916 may implement the process of detecting the voltage of the system in real time. In particular implementations, the fluctuation monitor block may determine how many times the fluctuation of the voltage crosses the threshold voltage. In other implementations, the processor 914 may determine how many times the fluctuation of the voltage crosses the threshold voltage. While the processor 914 and the fluctuation monitor block 916 are illustrated as two separate components in FIG. 9, in various implementations the processor 914 may be included within the fluctuation monitor block 916.

In various implementations, the processor 914 may be configured to compare the fluctuation of the voltages, or measured powers, sensed by the voltage sensor with the plurality of threshold values derived from the data stored in the memory. In various implementations the fuel gauge includes mode control logic 918, and based upon the comparison of the actual fluctuation of the voltages with the plurality of threshold values derived from the data stored in the memory, the mode control logic may determine which power mode the fuel gauge is to operate in. More specifically, the mode control logic may determine whether the fuel gauge should operate in the same mode and sample the voltage of the battery at the same frequency, operate in a less active mode and sample the voltage of the battery at a lesser frequency, or operate in a more active mode and sample the voltage of the battery at an increased frequency. The sampling frequencies may include, by non-limiting example, a zero sampling frequency, a low sampling frequency, a medium sampling frequency, or a high sampling frequency.

In various implementations, the fuel gauge 902 includes a sampling timer 920. The mode control logic 918 may communicate the mode the fuel gauge 902 should be operating in to the sampling timer 920, and the sampling timer 920 may in turn dictate the frequency of the sampling by the voltage sensor 904. In this manner, the voltage sensor is configured to repeatedly sample the measured power being drawn by the load from the battery at a sampling frequency corresponding to the power mode of the fuel gauge using the sampling timer. Accordingly, the fuel gauge 902 is configured to either increase, decrease, or maintain a sampling frequency based upon a measured power being drawn by a load coupled to the battery 908.

Figure 10:
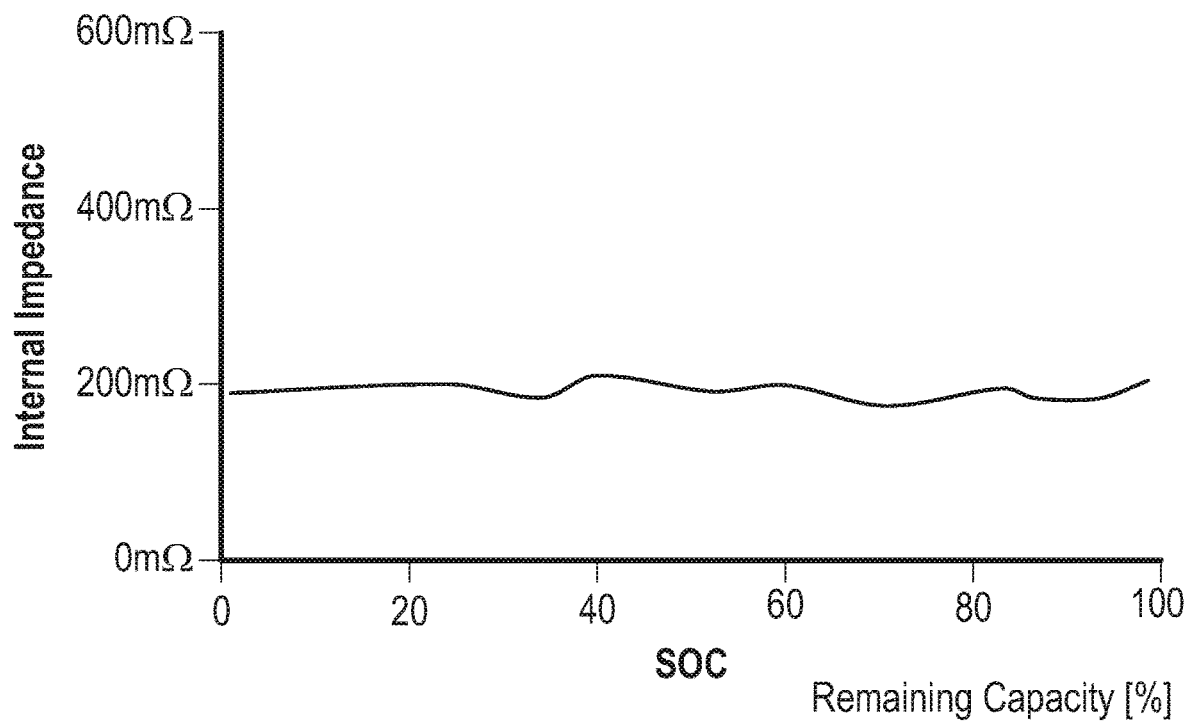
FIG. 10 is a graph showing internal impedance of a battery.

Referring to FIG. 10, a graph showing internal impedance/resistance of a battery is illustrated. As illustrated, the internal resistance of the battery may remain constant through the battery's entire capacity life cycle (or from 100% remaining capacity to 0% remaining capacity). The internal resistance may stay consistent by appropriately modifying the current at particular SOC values. In this manner, appropriate voltage thresholds may be set for the implementations of thresholds disclosed herein. As an illustrative example, a high voltage threshold of 0.2 volts may be set by multiplying the resistance of 0.2 ohms (as illustrated by FIG. 10) with 1 amp. Similarly, a medium threshold of 0.1 volts may be set by multiplying 0.2 ohms with 0.5 amps. Likewise, a low threshold of 0.02 volts may be set by multiplying 0.2 ohms with 0.1 amps.

Figure 11:
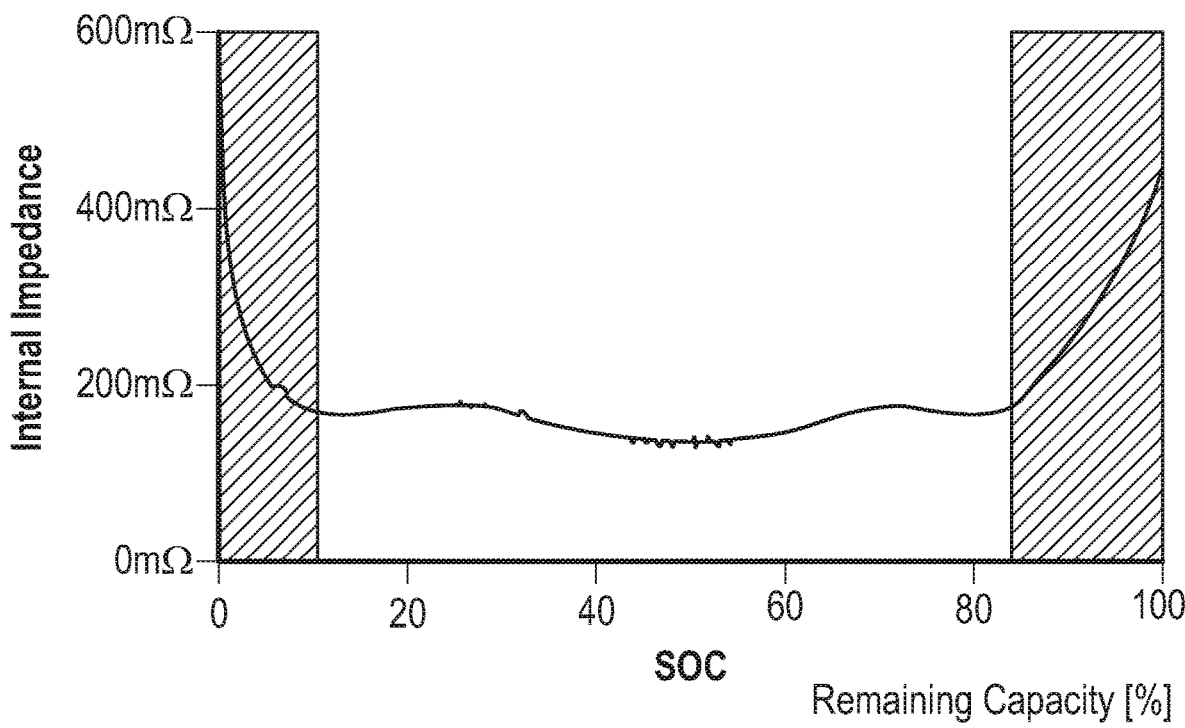
FIG. 11 is a graph showing varying internal impedance of a battery.

Referring to FIG. 11, a graph showing varying internal impedance/resistance of a battery is illustrated. In contrast with to the graph of FIG. 10, a battery's internal resistance may vary significantly across the battery's capacity life cycle. Alternatively, the graph may be characteristic of a particular battery's chemistry, any may be characteristic of the battery's chemistry from its first use.

Figure 12:
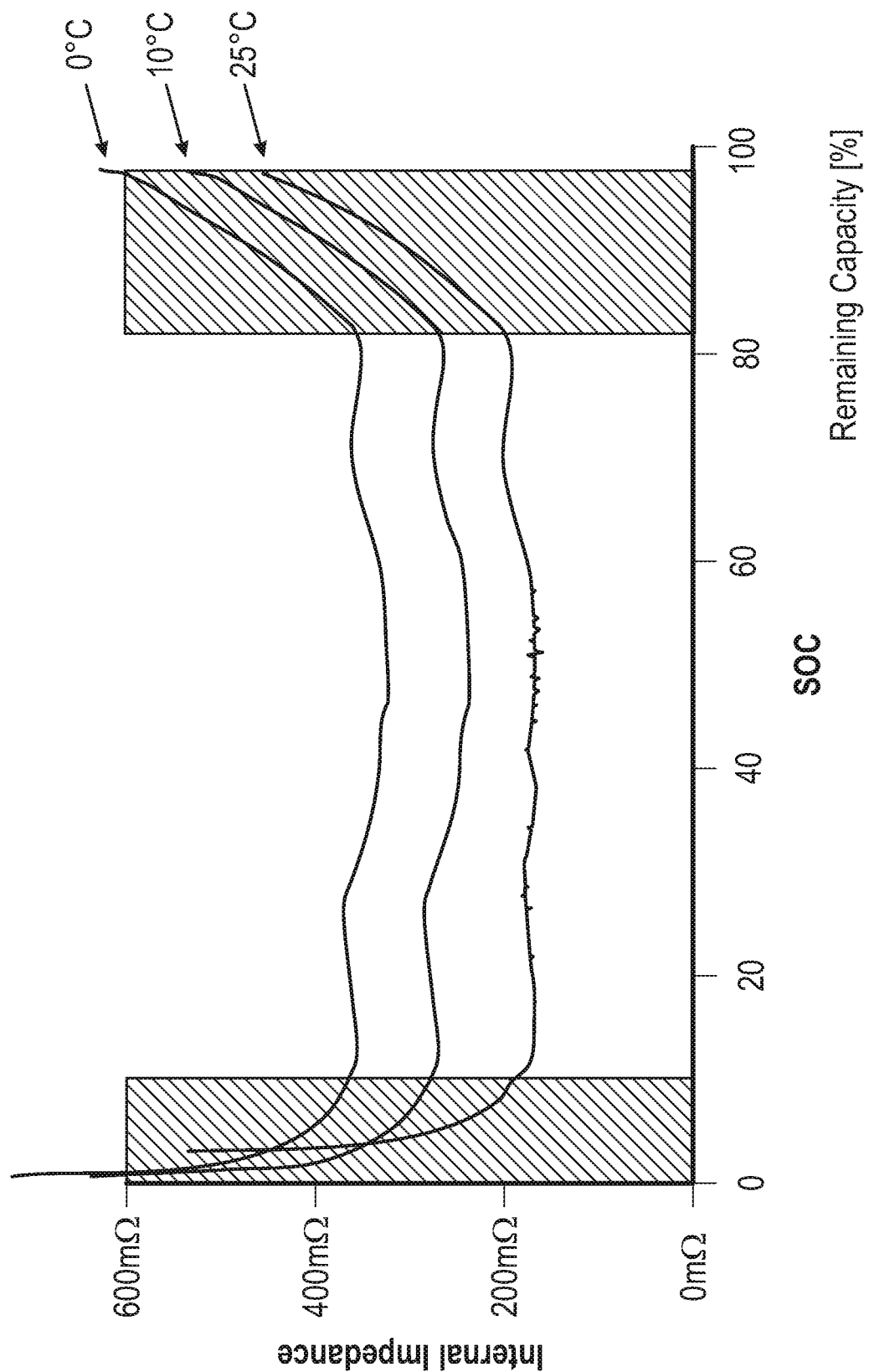
FIG. 12 is a graph showing how internal impedance of a battery is affected by temperature.

Referring to FIG. 12, a graph showing how internal impedance of a battery is affected by temperature is illustrated. As illustrated, varying temperatures of a battery may shift the internal resistance of a battery across the battery's capacity life cycle. More specifically, a battery at 0 degrees Celsius may have increased internal resistance as compared to a battery at 10 degrees Celsius, and the battery at 10 degrees Celsius may have increased internal resistance as compared to a battery at 25 degrees Celsius. As such, temperature parameters may be necessary in determining the threshold values based on internal resistance of a battery.

Referring to FIG. 13, a flow chart illustrating an implementation of a method for how threshold values are determined is illustrated. The method may include inputting a plurality of RSOC values and/or temperature parameters into a memory of a fuel gauge, as illustrated by block 1302. The RSOC values may be obtained using any method disclosed herein. The RSOC values and/or temperature parameters may be stored in a table within a memory. The method of determining the threshold values may include looking up the appropriate RSOC value and/or temperature parameter as illustrated by block 1304. Upon obtaining this data, the method may include calculating an internal resistance value as indicated by block 1306. The internal resistance values may be calculated by a processor. The internal resistance may then be multiplied by a current of the system, as illustrated by block 1308, in order to obtain a voltage threshold 1310. This may also be done by the processor.

Referring to FIG. 14, a flow chart illustrating an implementation of a method of how the sampling frequency is determined, and in turn, an implementation of a method for conserving power, is illustrated. The method may include sampling at least two measured powers, which may be voltages, from a power line coupled to a battery and determining a fluctuation value between the measured powers sampled, as indicated by block 1402. The fluctuation value may be determined by a fluctuation monitor block. The sampling frequency of the voltage sensor may be determined by a sampling timer coupled with the voltage sensor. Though not illustrated, the method may also include sensing a temperature of the battery through a temperature sensor included in the fuel gauge. In various implementations, more than two voltages, or measured powers, are sampled. In such implementations, a plurality of fluctuation values may be generated not just for the continual monitoring of the battery, but also to ensure that the fluctuation values are true fluctuation values and are not a result of noise.

In various implementations, the method may include storing a plurality of RSOC values corresponding to a capacitance of the battery in a memory. The RSOC values stored may be generated using any method disclosed herein. Further, the method may include calculating a plurality of threshold values using the method taught by FIG. 13.

As illustrated, in various implementations, the method may then include determining, as illustrated by block 1404, whether there is a load, charge, or discharge based upon the value of the fluctuation. This may be done by comparing the fluctuation value between the measured powers with one or more threshold power measurements derived from a table of values corresponding with the plurality of RSOC values of the battery and/or the internal resistance values of the battery. The one or more threshold power measurements may be derived according to the method set forth in FIG. 13. The method includes, using the fluctuation between the at least two measured power values, sending a signal using a processor of the fuel gauge to a mode control logic circuit to one of increase (if the fluctuation exceeds a necessary threshold), decrease (if the fluctuation fails to exceed the necessary threshold), or maintain (if the fluctuation exceeds one necessary threshold but not another) a sampling rate of the fuel gauge. More specifically, if there is no load, the fuel gauge is instructed to enter a slow operation stage and communicate to the voltage sensor to enter into the zero frequency sampling mode. If, on the other hand, the fluctuation value indicates that there is a charge or discharge, the method includes determining if the power level of the fuel gauge should operate in a relaxed mode by determining whether or not the fluctuation value exceeds a predetermined threshold. If it doesn't exceed the predetermined threshold, then the fuel gauge is instructed to enter into an operation stage illustrated by block 1410 and communicate to the voltage sensor to sample the voltage at a low sampling frequency mode corresponding to the relaxed mode of the fuel gauge. If, on the other hand, the fluctuation value exceeds the threshold, then the fuel gauge does not enter into the relaxed mode but determines whether the fluctuation value exceeds a predetermined threshold associated with the moderate mode as indicated by block 1412. If the fluctuation value does not exceed the threshold associated with the moderate mode, then the fuel gauge enters into the moderate mode, as indicated by block 1414, and communicates to the voltage sensor to increase the sampling frequency a medium frequency sampling mode associated with the moderate mode. If, on the other hand, the fluctuation value exceeds the threshold associated with the moderate mode, then it is determined that there is an active charge and the fuel gauge enters into a normal operation mode and communicates to the voltage sensor to increase the sampling frequency to a high sampling frequency mode.

As the voltage sensor continues to sample the voltage, it will continue to sense charges or discharges. If it senses discharges, or if the battery is transitioning from an active operation mode to a less active operation mode, such as a relaxed mode, then the same method may be used as outlined above to determine what the sampling frequency of the voltage by the voltage sensor should be. In such implementations, as the fluctuation between the sampled measured power values decreases, the fluctuation value may be less than particular thresholds. In such implementations, the fuel gauge may then enter into lesser power modes associated with less frequent sampling. In this manner the fuel gauge may autonomously change the sampling period and conserve power by only sampling the voltage of the battery as necessary.

As illustrated in the flow chart of FIG. 14, various currents are illustrated as associated with the various operation modes. It is understood that these currents could change as the various thresholds are variable and customizable. Further, while the method illustrated by FIG. 14 illustrates four different power modes of the fuel gauge, it is understood that the method for conserving power may include the ability of the fuel gauge to enter into more than or less than four differing power modes.

In places where the description above refers to particular implementations of fuel gauges and power conservation systems and implementing components, sub-components, methods and sub-methods, it should be readily apparent that a number of modifications may be made without departing from the spirit thereof and that these implementations, implementing components, sub-components, methods and sub-methods may be applied to other fuel gauges and power conservation systems.

What is claimed is:
1. A fuel gauge comprising:
   a voltage sensor coupled with a memory;
   a processor coupled with the memory;
   a mode control logic circuit coupled with the processor and the voltage sensor; and
   a sampling timer coupled with the mode control logic circuit and the voltage sensor;
   wherein the memory comprises a plurality of relative state of charge (RSOC) values of a battery;
   wherein the plurality of RSOC values are used to calculate a plurality of internal resistance values; and
   wherein the fuel gauge is configured to one of increase, decrease, or maintain a sampling frequency based upon a measured power being drawn by a load coupled to the battery.
2. The fuel gauge of claim 1, wherein the fuel gauge is configured to one of increase or decrease the sampling frequency from one of a zero sampling frequency, a low sampling frequency, a medium sampling frequency, or a high sampling frequency.
3. The fuel gauge of claim 1, wherein the plurality of RSOC values are derived using a Coulomb counting method.
4. The fuel gauge of claim 1, wherein the plurality of RSOC values are derived using a voltage tracking method.
5. The fuel gauge of claim 1, wherein the plurality of internal resistance values are calculated using a temperature of the battery.
6. The fuel gauge of claim 1, wherein the voltage sensor is configured to repeatedly sample the measured power being drawn by the load from the battery at a sampling frequency corresponding to a power mode of the fuel gauge using the sampling timer.
7. The fuel gauge of claim 1, wherein the fuel gauge is configured to compare a fluctuation between a plurality of measured power values to one or more threshold values derived from the plurality of RSOC values.
8. The fuel gauge of claim 1, further comprising a fluctuation monitor block coupled to the voltage sensor.
9. A fuel gauge comprising:
   a voltage sensor coupled with a memory;
   a processor coupled with the memory;
   a mode control logic circuit coupled with the processor and the voltage sensor;
   a temperature sensor coupled with the memory; and
   a sampling timer coupled with the mode control logic circuit and the voltage sensor;
   wherein the memory comprises a plurality of relative state of charge (RSOC) values and a plurality of temperature parameters;

wherein the plurality of RSOC values and the plurality of temperature parameters are used to calculate a plurality of internal resistance values; and wherein the fuel gauge is configured to one of increase or decrease a sampling frequency based upon a measured power being drawn by a load from a battery.

10. The fuel gauge of claim 9, wherein the fuel gauge is configured to one of increase or decrease the sampling frequency from one of a zero sampling frequency, a low sampling frequency, a medium sampling frequency, or a high sampling frequency.

11. The fuel gauge of claim 9, wherein the plurality of RSOC values are derived using a Coulomb counting method.

12. The fuel gauge of claim 9, wherein the plurality of RSOC values are derived using a voltage tracking method.

13. The fuel gauge of claim 9, wherein the voltage sensor is configured to repeatedly sample the measured power being drawn by the load from the battery at a sampling frequency corresponding to a power mode of the fuel gauge using the sampling timer.

14. The fuel gauge of claim 9, wherein the fuel gauge is configured to compare a fluctuation between two measured power values to one or more threshold values derived from the plurality of RSOC values.

15. A method of conserving power comprising:
sampling at least two measured power values of a battery using a voltage sensor coupled with a sampling timer;

determining a fluctuation between the at least two measured power values;

comparing the fluctuation between the at least two measured power values to one or more threshold power measurements, wherein the one or more threshold power measurements are derived from a table of values corresponding with a plurality of relative state of charge (RSOC) values of the battery; and using the fluctuation between the at least two measured power values, sending a signal to a mode control logic circuit to one of increase, decrease, or maintain a sampling rate of a fuel gauge.

16. The method of claim 15, further comprising sensing a temperature of the battery through a temperature sensor comprised in the fuel gauge.

17. The method of claim 16, wherein the temperature of the battery is used to calculate the one or more threshold power measurements.

18. The method of claim 15, wherein the RSOC values are generated through a Coulomb counting method.

19. The method of claim 15, wherein the RSOC values are generated through a voltage tracking method.

20. The method of claim 15, wherein a sampling frequency comprises one of a zero sampling frequency mode, a low sampling frequency mode, a medium sampling frequency mode, or a high sampling frequency mode.

* * * * *